(12) United States Patent
Niiyama et al.

(10) Patent No.: US 7,998,848 B2
(45) Date of Patent: Aug. 16, 2011

(54) METHOD OF PRODUCING FIELD EFFECT TRANSISTOR

(75) Inventors: Yuki Niiyama, Tokyo (JP); Seikoh Yoshida, Tokyo (JP); Masatoshi Ikeda, legal representative, Tokyo (JP); Hiroshi Kambayashi, Tokyo (JP); Takehiko Nomura, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 45 days.

(21) Appl. No.: 12/382,943

(22) Filed: Mar. 26, 2009

(65) Prior Publication Data

US 2009/0246924 A1 Oct. 1, 2009

(30) Foreign Application Priority Data

Mar. 28, 2008 (JP) ................................. 2008-088603

(51) Int. Cl.
*H01L 21/265* (2006.01)
(52) U.S. Cl. .................. 438/522; 438/795; 257/E21.12; 257/E21.454; 257/E21.324; 257/E21.497
(58) Field of Classification Search ................... 438/522, 438/795; 257/E21.454, E21.12, E21.497
See application file for complete search history.

(56) References Cited

U.S. PATENT DOCUMENTS

| 2003/0132439 A1 * | 7/2003 | Kimura et al. .................. 257/72 |
| 2005/0047459 A1 * | 3/2005 | Weidenheimer et al. ........ 372/43 |
| 2009/0170296 A1 * | 7/2009 | Kawaguchi .................... 438/522 |

FOREIGN PATENT DOCUMENTS

| JP | 60079769 A * | 5/1985 |
| JP | 2000-174034 | 6/2000 |
| JP | 2002289550 A * | 10/2002 |

OTHER PUBLICATIONS

Y. Irokawa et al., "Implantation temperature dependence of Si activation in AlGaN," Appl. Phys. Lett. 88 (2006) 182106.
S. Matsunaga et al., "Silicon implantation in epitaxial GaN layers: Encapsulant annealing and electrical properties," J. Appl. Phys. 95 (2004) 2461.
J. A. Fellows, "Electrical activation studies of GaN implanted with Si from low to high dose," Appl. Phys. Lett. 80 (2002) 1930.

* cited by examiner

*Primary Examiner* — Jarrett J Stark
(74) *Attorney, Agent, or Firm* — Kubotera & Associates, LLC

(57) ABSTRACT

The laser beam with a wavelength having a higher energy than the band gap energy of the material forming the carrier moving layer is irradiated to activate the impurities contained in the constituent layer of the field effect transistor in the method of producing the field effect transistor. The method of the invention does not apply the heating of the substrate or the sample stage to raise the temperature of the semiconductor layer using the thermal conductivity so as to activate the impurities. Thus, the implanted impurities can be activated without deteriorating the performance of the device and reliability.

10 Claims, 9 Drawing Sheets

FIG.3.1
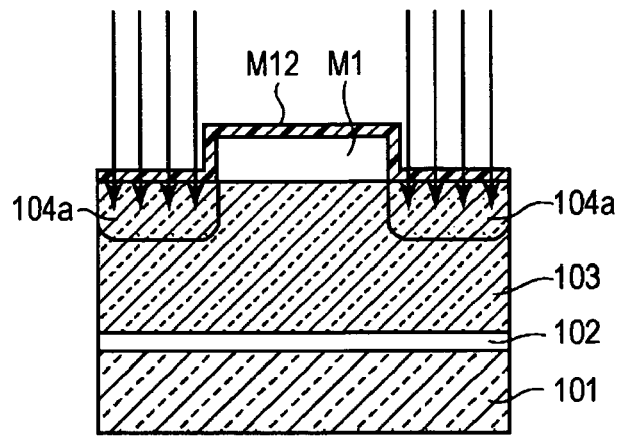
FIG.3.2
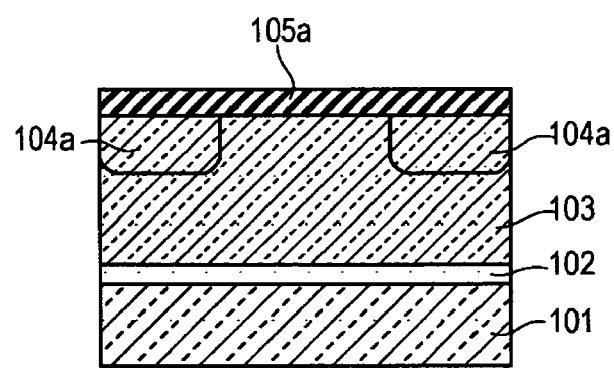
FIG.3.3
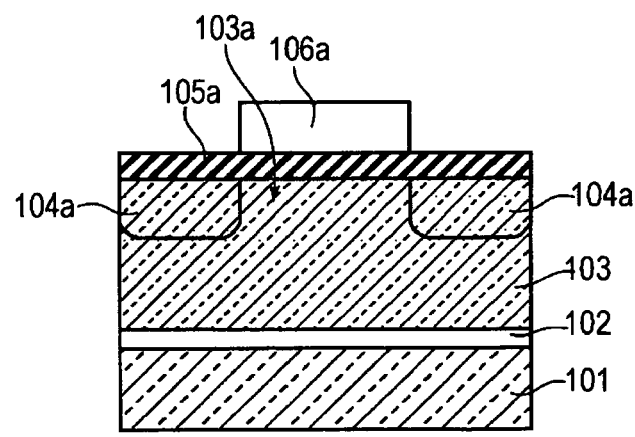

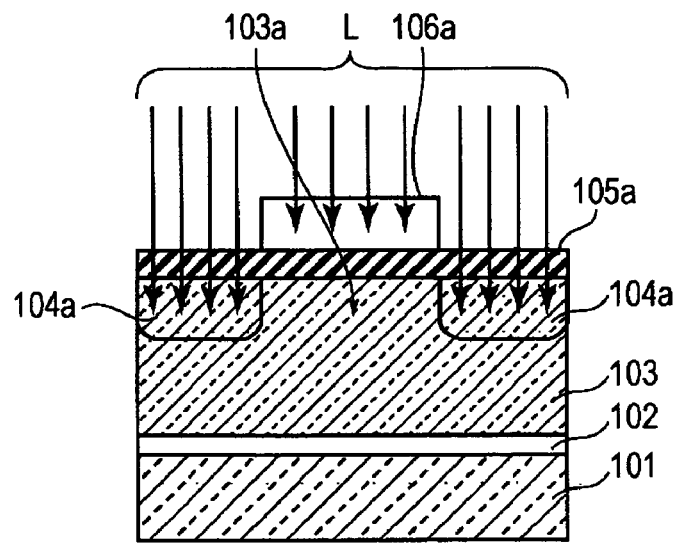
FIG.3.4
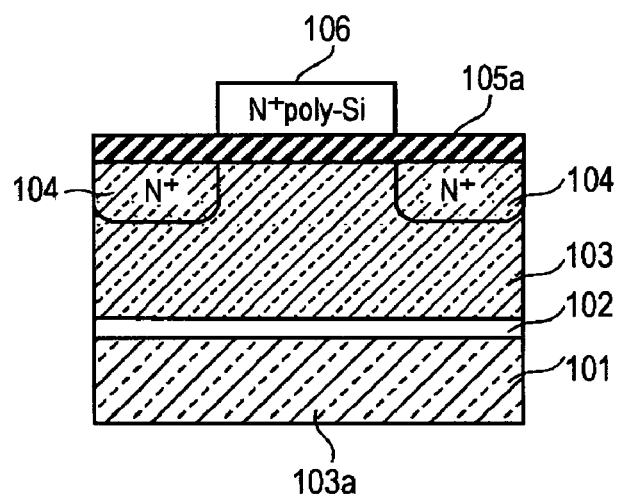
FIG.3.5
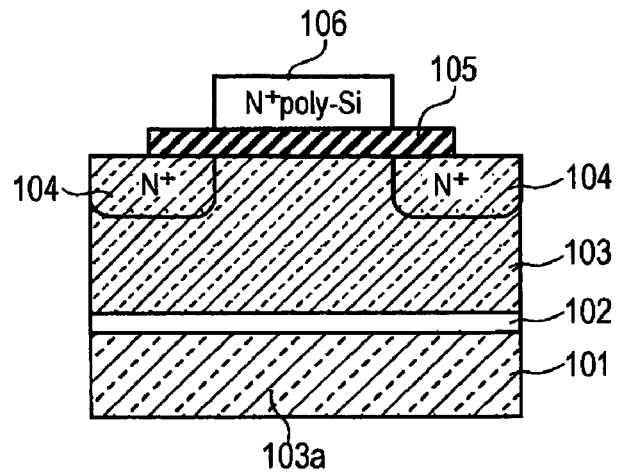
FIG.3.6

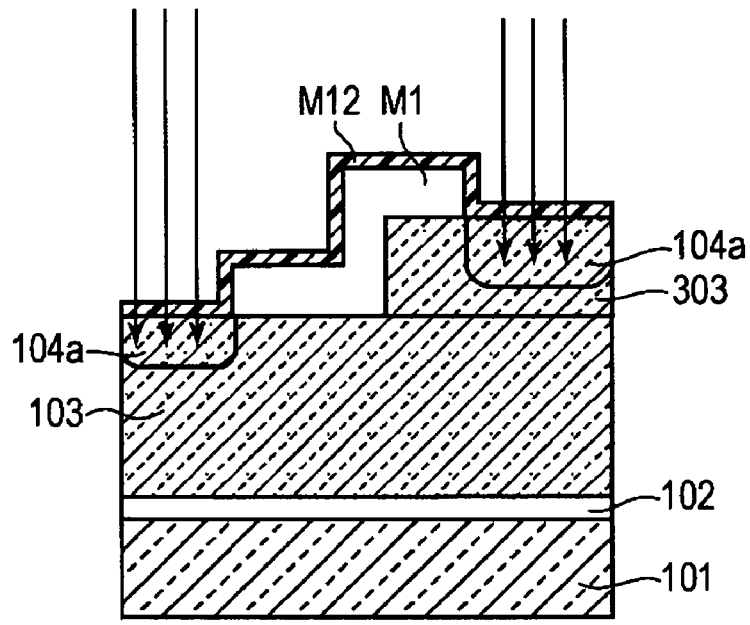
FIG.6.1
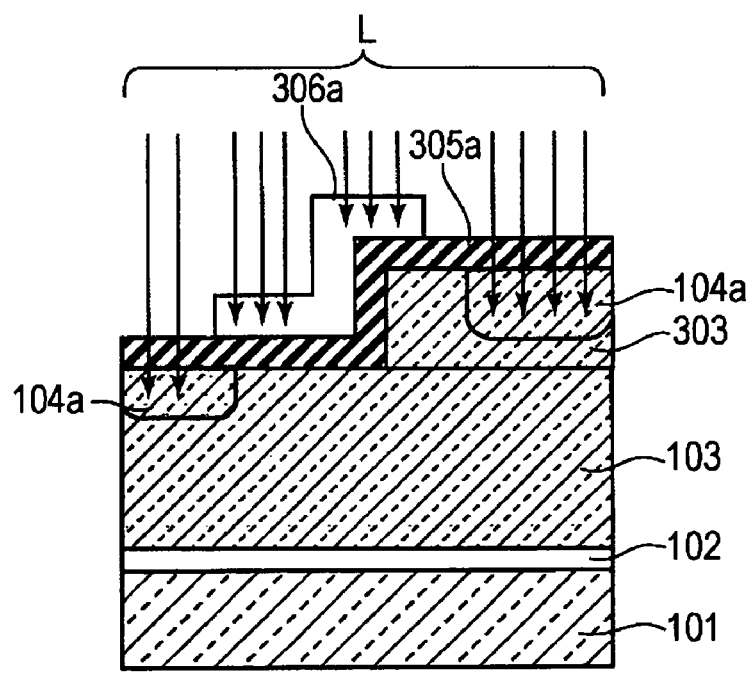
FIG.6.2

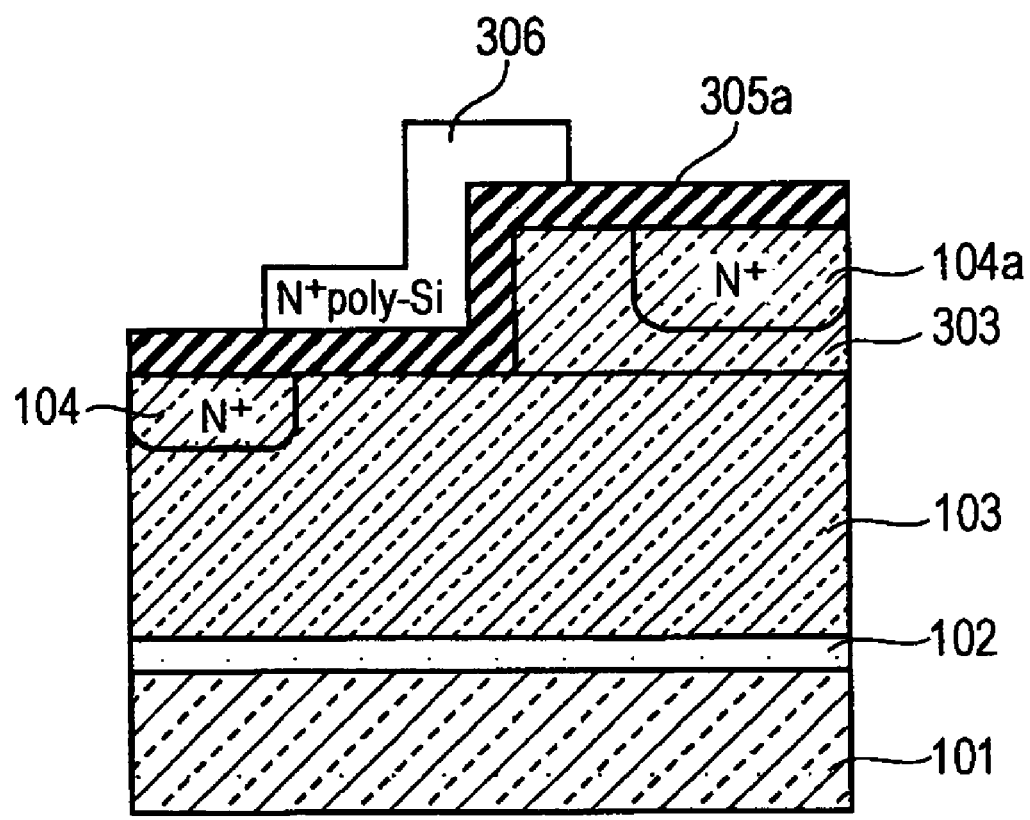
FIG.6.3

FIG. 8.1
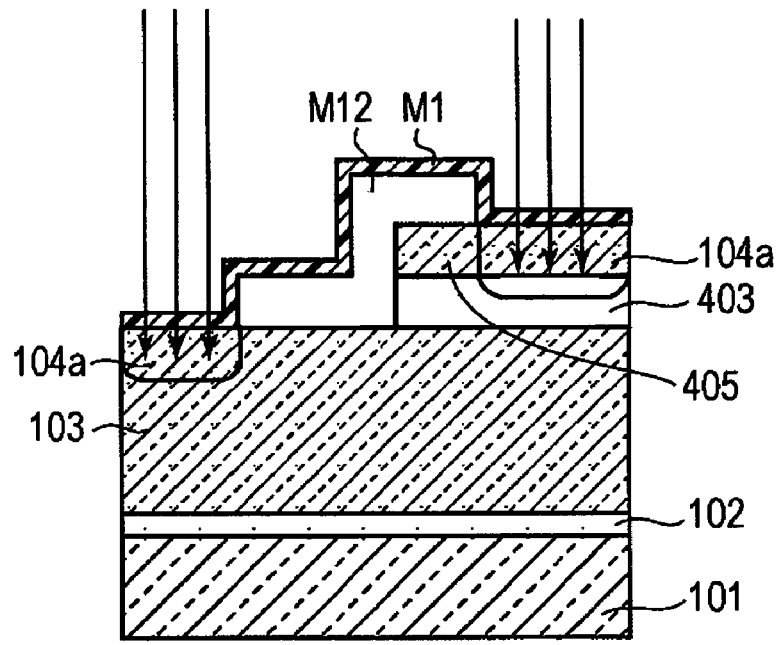
FIG. 8.2
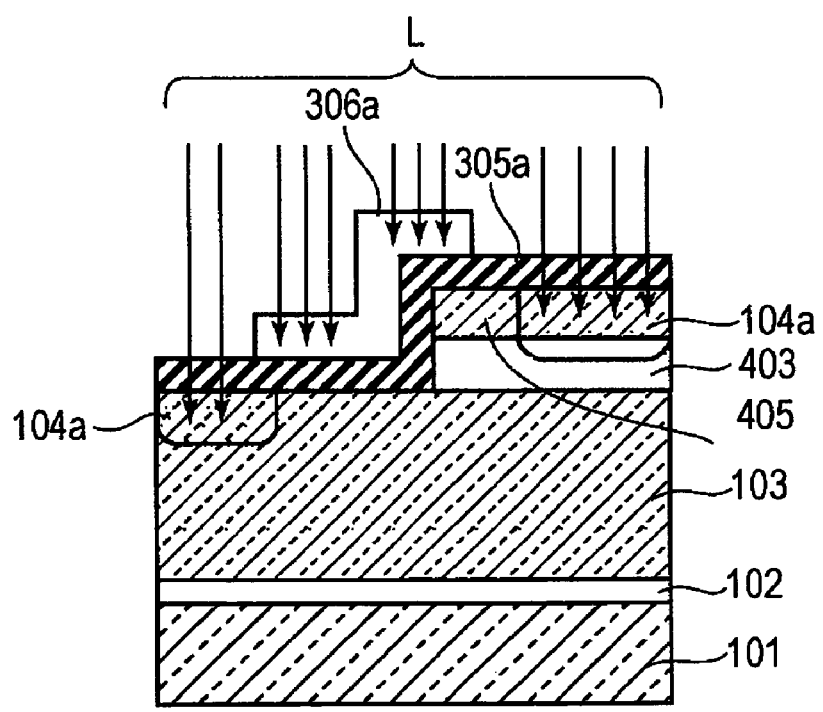

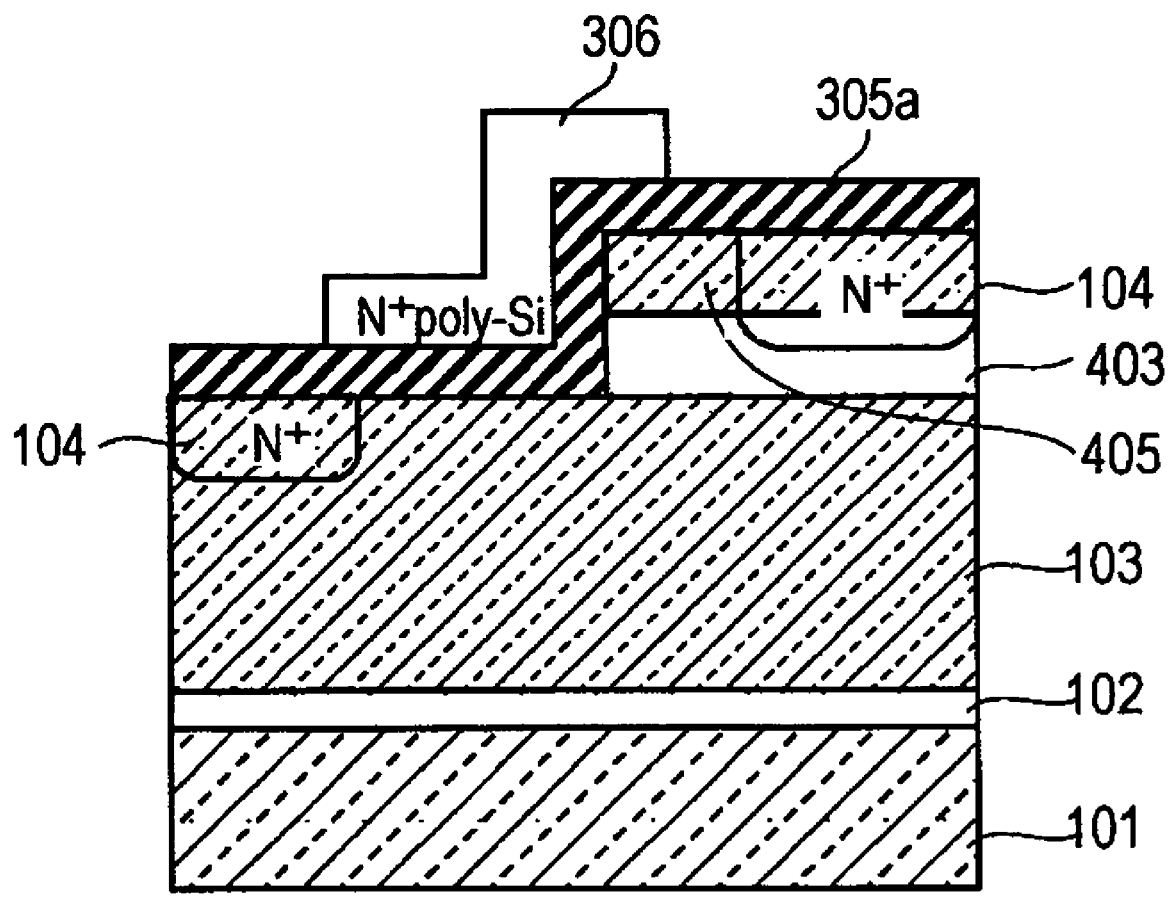
FIG.8.3

METHOD OF PRODUCING FIELD EFFECT TRANSISTOR

CROSS REFERENCE TO RELATED APPLICATIONS

This application claims priority from a Japanese application No. 2008-088603 filed on Mar. 28, 2008. The entire content of which is incorporated herein by reference.

BACKGROUND OF THE INVENTION

1. Field of the Invention

The present invention relates to a method of producing a field effect transistor having a carrier moving layer formed by group III nitride semiconductor material, GaAs or SiC.

2. Description of the Related Art

Recently, semiconductor devices using the group III nitride semiconductor material have been developed to increase in operational speed and to secure stable operation under high temperature condition (see, for example, Japanese patent application publication No. 2000-174034).

As such group III nitride semiconductor, there are exemplified GaN, InGaN, for example. When a MOSFET (Metal Oxide Semiconductor Field Effect Transistor) is fabricated using the group III nitride semiconductor, a high temperature annealing treatment is applied in an electric furnace or a RTA (Rapid Thermal Anneal) equipment. This treatment causes impurities implanted in a source forming region or a drain forming region in the semiconductor layer to function as a dopant, thus activating the impurities (see Y. Irokawa et al., "Implantation temperature dependence of Si activation in AlGaN," Appl. Phys. Lett. 88 (2006) 182106. S Matsunaga et al., "Silicon implantation in epitaxial GaN layers: Encapsultant annealing and electrical properties," J. Appl. Phys. 95 (2004) 2461. J. A. Fellows, "Electrical activities studies of GaN implanted with Si from low to high dose," Appl. Phys. Lett. 80 (2002) 1930).

Incidentally, in the heat treatment such as the high temperature annealing, an infrared light is irradiated to the substrate or a sample stage or the like. The irradiated light heats the substrate or a sample stage so that the temperature of the semiconductor layer is raised by the heat transfer so as to activate the impurities implanted in the semiconductor layer.

Very high temperature of the substrate is required in the fabricating method in which the impurities implanted in the semiconductor layer are activated by the thermal conductivity from the substrate or the sample stage. For example, when a GaN film is used as the semiconductor layer, at least 1100 degrees centigrade of temperature is required as the sample stage temperature so that the temperature of the electric furnace is set to be at least 1200 degrees centigrade to attain the above described temperature of the sample stage.

Since the above described temperature is over the temperature at which the GaN film grows, the Ga droplets on the surface of the GaN film, or the nitrogen atom desorbs the GaN film and then the Ga atom evaporated the GaN film. Then, further, the crystalline defect called as a pit is generated on the surface of the GaN film depending on a cycle in which the nitrogen atom desorbs. For example, when a sapphire substrate is used, the Ga desorbs or the pit is formed on the surface of the GaN film after being heated for 10 seconds in the RTA at the temperature of at least 1200 degrees centigrade. In addition, when the silicon (Si) substrate is used, the Ga droplets or the pit is formed on the surface of the GaN film after being heated for 10 seconds in the RTA at the temperature of at least 1100 degrees centigrade. Furthermore, the GaN film is peeled off the Si substrate, or the Gan film is broken after being heated at least 10 seconds in the electric furnace at the temperature of at least 1200 degrees centigrade. This phenomenon is due to a large difference in the heat expansion coefficient, the lattice constant, and the heat transfer rate between the Si substrate and the GaN film, thus not enabling to fabricate the FET.

Furthermore, among the above described problems, the segregation of the Ga atom forming the semiconductor layer and the formation of the pit appears even in a region where the impurities are not implanted, for example the region directly underneath the gate insulation film. Accordingly, when a MOSFET is fabricated applying the above described conventional techniques, the channel mobility movement is lowered in the channel region, or blocking characteristic thereof is deteriorated. In addition, when a HEMT (High Electron Mobility Transistor) is fabricated, the density of the two-dimensional electron gas is reduced.

One of the objects of the invention is to provide a method of producing a field effect transistor which enables to activate the implanted impurities without deteriorating the performance and reliability of the device.

SUMMARY OF THE INVENTION

In order to solve the above described problem to attain the object, a method of producing a field effect transistor having a carrier moving layer formed of a material including one of a group III nitride semiconductor material, GaAs and SiC, comprises the steps of: irradiating a laser beam having a higher energy than a band gap energy of the material forming the carrier moving layer; and activating impurities contained in a constituent layer of the field effect transistor.

Furthermore, the method of producing the field effect transistor of the invention comprises: impurities implanting step of implanting impurities in a prescribed region of the carrier moving layer; protective film forming step of forming a protective film having a lower bang gap energy than the band gap energy of the material forming the carrier moving layer on a non impurities implant region in the carrier moving layer; and activating step of irradiating the laser beam after forming the protective film to activate the impurities.

The laser beam with a wavelength having a higher energy than the band gap energy of the material forming the carrier moving layer is irradiated to activate the impurities contained in the constituent layer of the field effect transistor in the method of producing the field effect transistor. The method of the invention does not apply the heating of the substrate or the sample stage to raise the temperature of the semiconductor layer using the heat transfer so as to activate the impurities. Thus, the implanted impurities can be activated without deteriorating the performance of the device and reliability.

Other embodiments of the invention, technical and industrial superiorities of the invention can be more specifically understood with reference to the embodiments of the invention described later and attached drawings.

BRIEF DESCRIPTION OF THE DRAWINGS

FIG. 3-1 is a schematic view to describe one embodiment of the method of producing the field effect transistor of the invention depicted in FIG. 2;

FIG. 3-2 is a schematic view to describe one embodiment of the method of producing the field effect transistor of the invention depicted in FIG. 2;

FIG. 3-3 is a schematic view to describe one embodiment of the method of producing the field effect transistor of the invention depicted in FIG. 2;

FIG. 3-4 is a schematic view to describe one embodiment of the method of producing the field effect transistor of the invention depicted in FIG. 2;

FIG. 3-5 is a schematic view to describe one embodiment of the method of producing the field effect transistor of the invention depicted in FIG. 2;

FIG. 3-6 is a schematic view to describe one embodiment of the method of producing the field effect transistor of the invention depicted in FIG. 2;

FIG. 4 is a cross sectional view showing an example of the structure of the FET;

FIG. 5 is a cross sectional view showing an example of the structure of the FET;

FIG. 6-1 is a schematic view to describe one embodiment of the method of producing the field effect transistor of the invention depicted in FIG. 5;

FIG. 6-2 is a schematic view to describe one embodiment of the method of producing the field effect transistor of the invention depicted in FIG. 5;

FIG. 6-3 is a schematic view to describe one embodiment of the method of producing the field effect transistor of the invention depicted in FIG. 5;

FIG. 8-1 is a schematic view to describe one embodiment of the method of producing the field effect transistor of the invention depicted in FIG. 7;

FIG. 8-2 is a schematic view to describe one embodiment of the method of producing the field effect transistor of the invention depicted in FIG. 7; and FIG. 8-3 is a schematic view to describe one embodiment of the method of producing the field effect transistor of the invention depicted in FIG. 7.

DETAILED DESCRIPTION OF THE PREFERRED EMBODIMENTS

Figure 1:
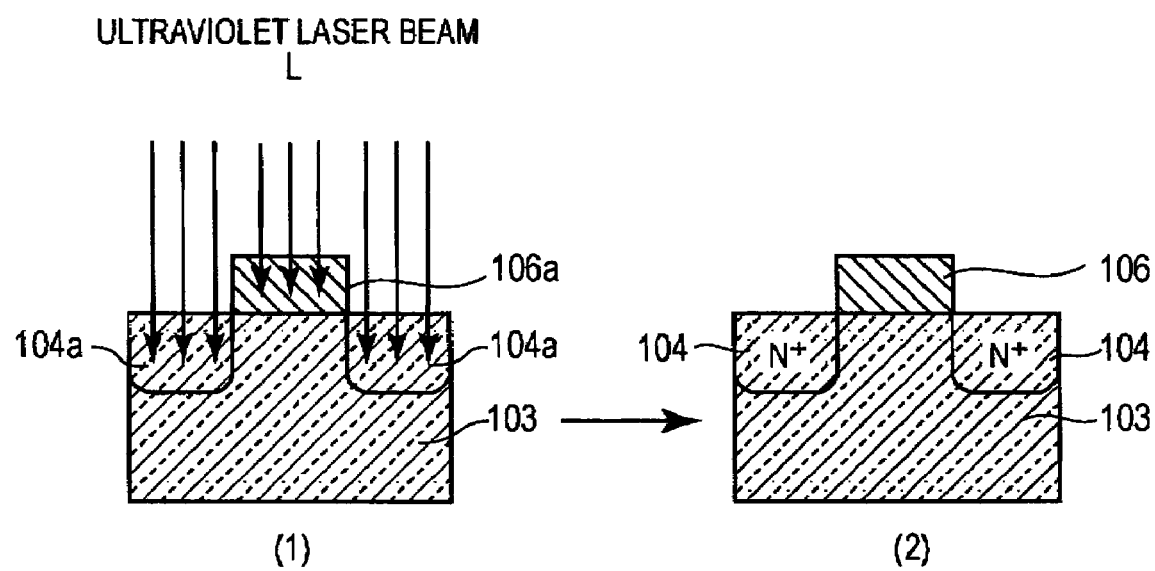
FIG. 1 is a schematic view to describe one embodiment of the method of producing the field effect transistor of the invention.

Embodiments of the present invention are described with reference to the drawings. The present invention is not limited to the embodiments described hereunder. In the drawings, the same part is denoted by the same reference numeral. Furthermore, since the drawing is a schematic view, it should be noted that the relationship between the thickness of the respective layers and the widths, proportion of the respective layers are different from the practical layers. Between the drawings, different sizes and proportions are contained.

In the method of producing the field effect transistor of the invention, a laser beam with the wavelength having higher energy than a band gap energy of the forming material of the carrier moving layer is irradiated to activate the impurities contained in the constituent layer of the field effect transistor. This is contrary to the above described conventional method, i.e., the infrared ray is irradiated to the substrate or sample stage to heat same so that the temperature of the semiconductor layer is raised by the heat transfer to activate the impurities.

FIG. 1 is a schematic view of describing one embodiment of the method of producing the field effect transistor of the invention. In the method of producing the field effect transistor of this embodiment of the invention, a carrier moving layer is formed by a GaN layer 103 which has band gap energy of 3.4 eV. A dielectric film 106a is formed onto a non impurities implant region excluding impurities implant regions 104a on the GaN layer, in which n-type impurities are implanted. The material of the dielectric film 106 is such as amorphous silicon having smaller band gap energy than that of the GaN layer. Then, ultraviolet laser beam L is irradiated to the GaN layer 103 and the dielectric film 106a.

The ultraviolet laser beam L has wavelength within a range of 0.15 μm (included) to 0.365 μm (included), where 0.15 μm is the minimum value defined as the laser beam. The band gap energy of the GaN is 3.4 eV, and the wavelength of the light corresponding to the above energy of 3.4 eV is 0.365 μm. A material film can absorb the light when the light with the wavelength corresponding to the energy larger than the band gap energy of the material film itself is irradiated. The GaN layer 103 therefore absorbs the irradiated ultraviolet laser beam L, when the ultraviolet laser beam with the wavelength having at least 3.4 eV energy of the band gap energy of the GaN. Then the absorbed ultraviolet laser beam L in the GaN layer is converted to the thermal energy to raise only the temperature of the region irradiated by the ultraviolet laser beam L.

Furthermore, the dielectric film 106a is formed onto the non impurities implant region in the GaN layer 103. The dielectric film 106a has smaller band gap energy than the band gap energy of 3.4 eV of the GaN layer 103. For example, the amorphous silicon has the band gap energy of 1.1 eV. Thus, the dielectric film 106a also absorbs the irradiated ultraviolet laser beam L to raise the temperature thereof. When the thickness of the dielectric film 106a is set to be the level in which the ultraviolet laser beam L does not trespass the dielectric film 106a, the ultraviolet laser beam L irradiated on the dielectric film 106a can be prevented from being incident in the portion of the GaN layer 103 directly beneath the dielectric film 106a, i.e., non impurities implant region in the GaN layer 103.

As depicted in FIG. 1(1), the dielectric film 106a having a prescribed thickness is formed onto the non impurities implant region in the GaN layer, so that the ultraviolet laser beam L can be irradiated only to the impurities implant regions 104a in the GaN layer in the method of producing the field effect transistor of this embodiment. As a result, only the temperatures of the impurities implant regions 104a are raised to enable to diffuse and activate the impurities implanted in the impurities implant regions 104a. More specifically, the n-type impurities in the impurities implant regions 104a of the GaN layer are activated to form N$^+$GaN regions 104, as depicted in FIG. 1(2).

As described above, the ultraviolet laser beam L with the wavelength having higher energy than the band gap energy of the GaN layer forming the carrier moving layer is irradiated only to the impurities implant regions in the GaN layer in the method of producing the field effect transistor of this embodiment. Thus, only the temperature of the impurities implant regions 104a are raised to the temperature which enables to activate the impurities so that the impurities implanted in the impurities implant regions 104a are activated.

Accordingly, the method of producing the field effect transistor of this embodiment does not activate the impurities implanted in the semiconductor layer by heating the substrate or the sample stage with the irradiation of the infrared light to raise the temperature of the semiconductor layer by the transferred heat, as conventionally carried out. In other words, the substrate and the constituent layers of the field effect transistor are not required to be placed under the temperature condition of at least 1100 degrees centigrade. Furthermore, the substrate itself is not heated to the high temperature in the method of producing the field effect transistor of this embodiment.

Accordingly, since the substrate and the surface of the GaN film are not heated to the high temperature, Ga is not segregated on the surface of the GaN film, and the nitrogen atom and the Ga atoms do not desorbed of the GaN film so that the pit is not formed in the method of producing the field effect transistor of this embodiment. Furthermore, since the nitrogen atom does not break out of the GaN film, the resistance is not increased.

As a result, according to this embodiment of the invention, the carrier mobility in the channel forming region can be prevented from being lowered. Further, the blocking characteristics of the channel forming region can be prevented from being deteriorated. In addition, when the HEMT (High Electron Mobility Transistor) is fabricated, the density of the two-dimensional electron gas is prevented from being reduced. Furthermore, since the substrate itself is not heated to the high temperature, the GaN film is not peeled off when the Si substrate is used, or the GaN film is not broken, thus enabling to stably fabricate the field effect transistor.

The dielectric film 106a layered on the non impurities forming region in the GaN layer is formed by a polysilicon (poly-Si) film containing such impurities as phosphorus and functions as a gate electrode, for example. The band gap energy of the polysilicon film is 1.1 eV. In this case, the ultraviolet laser beam L, irradiated to the surface of the GaN layer 103 and the surface of the dielectric film 106a to activate the impurities in the impurities implant region in the GaN layer, is also absorbed by the dielectric film 106a. The absorption of the ultraviolet laser beam L makes raised both of the temperatures of the impurities implant region 104 in the GaN layer 103 and the dielectric film 106a itself, so that such impurities as phosphorus contained in the dielectric film 106a is activated to function as the gate electrode.

As described above, according to the method of producing the field effect transistor of this embodiment of the invention, the dielectric film 106a layered on the non impurities forming region in the GaN layer is formed by a polysilicon (poly-Si) film containing impurities and functions as a gate electrode. Thus, the impurities in both of the impurities implant region 104 in the GaN layer 103 and the dielectric filth 106a can be simultaneously activated.

Contrary to the above, according to the conventional method, the separate heat treatment to activate the impurities of the gate electrode film was necessary in addition to the annealing treatment to activate the impurities implanted in the GaN layer. More specifically, according to the method of producing field effect transistor, one time irradiation of the ultraviolet laser beam L makes it possible to activate both of the impurities implanted in the GaN layer and contained in the dielectric film 106a to simplify the fabricating processes in comparison with the conventional method. Accordingly, the contamination and the heat cycle procedure caused by many fabricating processes can be reduced so that the reliability of the fabricated field effect transistor can be improved.

Figure 2:
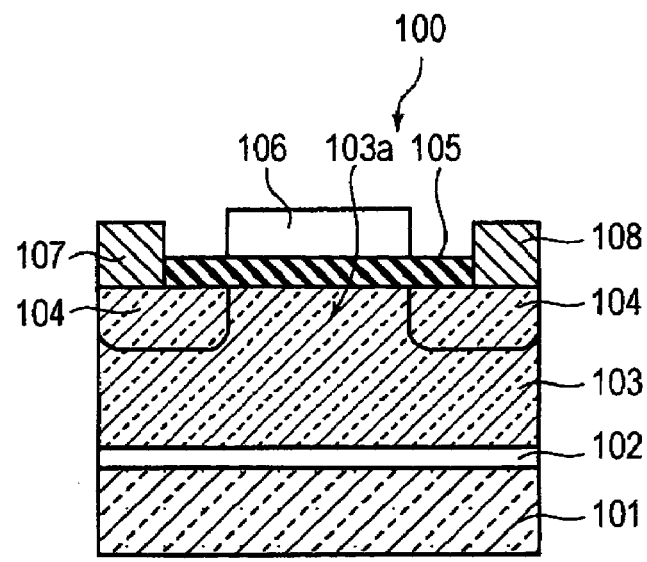
FIG. 2 is a cross sectional view showing an example of the structure of the FET.

The case of the FET 100, in which the method of producing the field effect transistor is applied, is more specifically described with reference to FIG. 2. FIG. 2 is a cross sectional view of a GaN field effect transistor cut along the direction vertical to the substrate and parallel to the channel length direction.

As depicted in FIG. 2, the FET 100 includes a buffer layer 102 formed to secure adhesiveness between the substrate 101 and the GaN layer, the GaN layer in which the p-type impurities are doped to adjust a threshold value and in addition, $N^+$GaN regions 104 (the impurities diffusion region) functioning as the source/drain are formed, a gate insulating film 105 to cover at least a channel forming region 103a, a gate electrode 106 formed onto the gate insulating film 105, and a source electrode 107 and a drain electrode 108 formed on the respective $N^+$GaN regions 104 to implement ohmic contact therewith. The GaN layer 103 functions as the carrier moving layer.

The FET 100 has a so-called MOSFET structure in which the gate insulating layer 105 and the gate electrode 106 are formed onto the channel region 103a in the GaN layer 103. As the substrate 101, silicon (Si) substrate (111), sapphire ($Al_2O_3$) substrate, silicon carbide (SiC) substrate, zirconium boride ($ZrB_2$) substrate or the like can be applied. Although the FET 100 with GaN applied as the carrier moving layer is described as an example, such nitride semiconductor as AlGaN, BGaN, InGaN, AlN, InN having at least one of Al, Ga, In and B which are group-III elements can be applied.

Then, the method of producing the FET depicted in FIG. 2 is described with reference to FIGS. 3-1 to 3-6. A buffer layer 102 is grown using MOCVD (metal organic chemical vapor deposition) on the substrate 101. The buffer layer comprises a layered film (AlGaN/GaN film), for example, of undoped AlGaN (aluminum gallium nitride) and GaN (gallium nitride) having 500 nm thickness. The buffer layer may be formed using HVPE (halide vapor phase epitaxy) or MBE (molecular beam epitaxy), for example, not limited to the MOCVD. Then, a GaN layer with magnesium (Mg) doped having a thickness of 2 μm, for example, is epitaxially grown with the use of MOCVD, HVPE, or MBE on the buffer layer 102.

Then, a silicon dioxide film ($SiO_2$ film) having a thickness of about 1000 nm, for example, is deposited using PECVD (plasma enhanced chemical vapor deposition) on the GaN layer. Then, apertures are formed by the exposure and development processes above the region in which the impurities implant regions 104a are formed in the GaN layer 103. As depicted in FIG. 3-1, a mask oxide film M1 having apertures is formed, which expose the surface of the regions forming the impurities implant region 104a. After that, photoresist is removed by the use of acetone.

Then, Si ions are implanted in the GaN layer 103 with the use of the mask oxide film M1 by the conventional ion implantation system. In this case, for example, the Si ions are implanted under the condition of $4 \times 10^{14}$ cm/45 keV so that the Si ions are implanted within the region of from 10 nm to 50 nm from the surface of the GaN layer 103. This process corresponds to the impurities implant process in the claims. As a result, the impurities implant regions 104a are formed, in which the Si ions of n-type impurities are implanted. After that, the mask oxide film M1 and $SiO_2$ film M12 are removed by the use of hydrofluoric acid, for example.

Then, as depicted in FIG. 3-2, a gate insulating film 105a is formed using PECVD (plasma enhanced chemical vapor deposition) all over the surface of the substrate. The gate insulating film 105a comprises one of $SiO_2$ film, $SiN_x$ film, $Al_2O_3$ film and MgO film which can transmit the above described ultraviolet laser beam L.

After that, a polycrystalline silicon (poly-Si) film with phosphorus (P) doped is formed using LPCVD (low pressure chemical vapor deposition) or sputtering all over the surface of the substrate. Then, as depicted in FIG. 3-3, the dielectric film 106a functioning as the gate electrode is formed applying photolithography and etching techniques on a channel forming region 103a corresponding to the above described non impurities implant region. This process corresponds to the protective film forming process in the claims.

Figure 4:
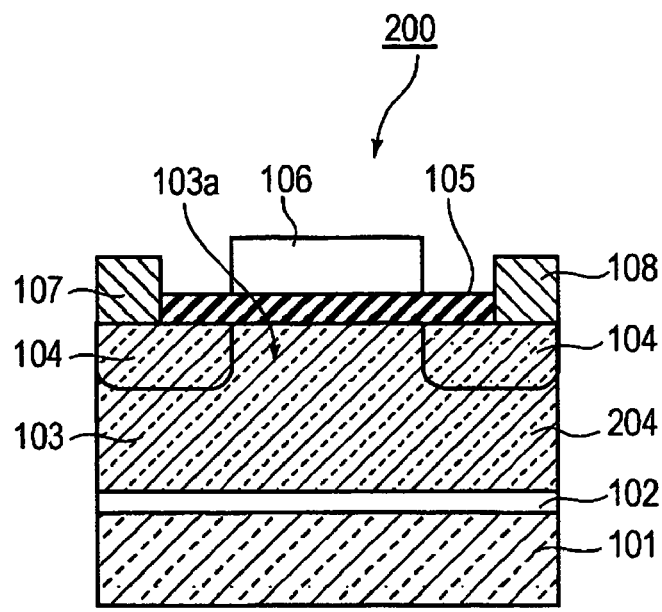

Then, as depicted in FIG. 3-4, the ultraviolet laser beam L is irradiated to all the surface of the substrate to implement the activation process using ultraviolet lasing system. Incidentally, a laser source in the general laser oscillation device is a pulsed beam source which pulse-oscillates laser beam.

Since the gate insulating film layer 105*a* can transmit the ultraviolet laser beam L, the ultraviolet laser beam L can reach the impurities implant regions 104*a* through the gate insulating film layer 105*a*. On the other hand, the dielectric film 106*a* is formed on the channel forming region except the impurities implant regions 104*a*. Accordingly, the ultraviolet laser beam L reaching the region excluding the impurities implant regions 104*a* is absorbed by the dielectric film 106*a* so that the ultraviolet laser beam L hardly reach into the GaN layer 103 excluding the impurities implant regions 104*a*.

Figure 5:
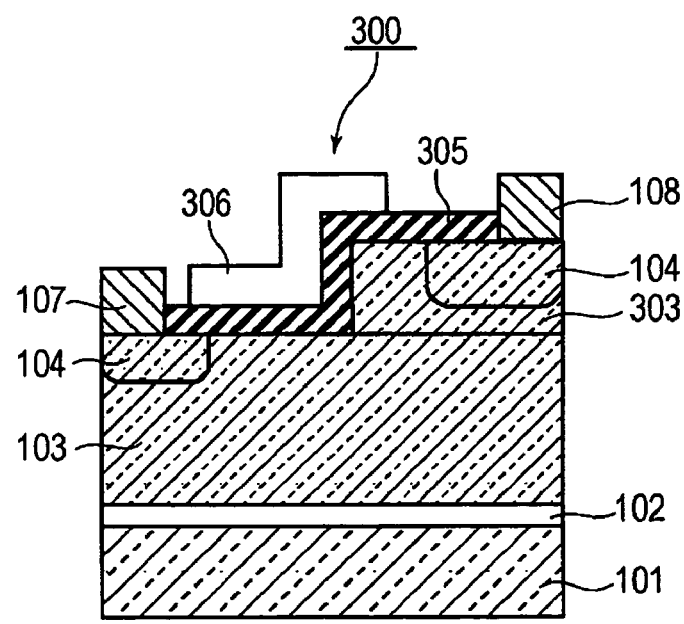

As a result, the temperature of the impurities implant regions 104*a* is raised by the absorption of the ultraviolet laser beam L. The Si ions in the impurities implant regions 104*a* are activated to function as dopant to form N$^+$GaN region, as depicted in FIG. 3-5. The output of the ultraviolet lasing device is controlled in such manner that the ultraviolet laser beam L is incident only on the vicinity of the surface of the GaN layer 103. Thus, only the temperature of the vicinity of the surface of the GaN layer 103 is raised.

In addition, since the band gap energy of the reached ultraviolet radiation is 1.1 eV, the poly-Si film also absorbs the ultraviolet laser beam L to heat the dielectric film 106 itself by the radiation heat, thus raising the temperature of the inside thereof. As a result, the phosphorus (P) contained in the dielectric film 106*a* is activated so that the dielectric film 106*a* becomes N$^+$ type to function as the gate electrode 106, as depicted in FIG. 3-6.

Furthermore, the gate insulating film layer 105*a* underneath the dielectric film 106*a* is made of the material having lower heat transfer than that of the dielectric film 106*a*. Accordingly, even if the heat within the dielectric film 106*a* is transferred to the GaN layer 103, the transferred heat is blocked by the gate insulating film layer 105*a*, thus the heat is not transferred to the GaN layer 103. Thus, the surface of the GaN layer 103 directly beneath the dielectric film 106*a*, i.e., the surface of the channel forming region 103, is not heated to the high temperature. As a result, no N atom and Ga atom desorb to the surface of the channel region, and the low carrier movement as well as the deterioration of the breakdown voltage are not induced.

Then, the apertures to expose each of N$^+$GaN regions 104 are formed in the gate insulating film layer 105*a* applying the photolithography and etching techniques, as depicted in FIG. 3-6. The gate insulating film layer 105*a* excluding the aperture regions functions as the gate insulating film 105 in the region directly beneath the gate electrode. The source electrode 107 and the drain electrode 108 are formed within the respective apertures, which form the ohmic contact with each of the N$^+$GaN regions 104, as depicted in FIG. 3-6. The source electrode 107 and the drain electrode 108 are formed by a layered film (Ti/Al film) of titanium (Ti) and aluminum (Al). The source electrode 107 and the drain electrode 108 may be formed by other material than the Ti/Al film, as far as it is possible to be the ohomic contact with the N$^+$GaN region. Thus, the FET 100 having the cross sectional structure as depicted in FIG. 2 is fabricated.

As described above, according to the present invention, the ultraviolet laser beam L is irradiated to raise the temperature of only the impurities implant regions 104 and the dielectric film 106*a*, instead of raising the temperature of the whole substrate, so as to selectively activate the impurities contained only in the impurities implant regions 104 and the dielectric film 106*a*. Thus, it is possible to fabricate the FET 100 in which Ga is not segregated on the surface of the GaN film, and pits caused by evaporating of N atom and Ga atom as well as the increase of the resistance caused by breaking out of N from the GaN film can be effectively prevented from being generated, contrary to the conventional problems. Furthermore, since one time of irradiation of the ultraviolet laser beam L can activate the both of the impurities implanted in the GaN layer 103, and contained in the dielectric film 106*a*, it is possible to fabricate the FET 100 by simple processes compared with the conventional processes so as to improve the reliability of the FET 100.

The case of the FET 200, in which the method of producing the field effect transistor is applied, is more specifically described with reference to FIG. 4. FIG. 4 is a cross sectional view of a GaN field effect transistor (FET 200) cut along the direction vertical to the substrate and parallel to the channel length direction.

As depicted in FIG. 4, in the FET 200, a RESURF (reduced surface field) region 204 is added to the upper layer portion of the GaN layer 103 at the drain side, in addition, the N$^+$GaN regions 104 at the drain side is apart from the gate electrode 106 in the same embodiment of the FET 100 depicted in FIG. 2. According to the above described structure, the higher breakdown voltage is easily realized in the FET 200 compared with the FET 100 depicted in FIG. 2.

The RESURF region 204 is a N$^-$ region with the n-type impurities such as the Si ions doped at lower concentration than the N$^+$GaN regions 104. As the n-typed impurities doped in the RESURF region 204, Ge, Se, and Te can be applied.

The case of the FET 300, in which the method of producing the field effect transistor is applied, is more specifically described with reference to FIG. 5. FIG. 5 is a cross sectional view of a GaN field effect transistor (FET 300) cut along the direction vertical to the substrate and parallel to the channel length direction.

As depicted in FIG. 5, in the FET 300, a N$^-$GaN layer 303 covering the surface of the GaN layer 103 is added at the drain side, the N$^+$GaN regions 104 in the FET 100 is formed in the upper layer portion of the N$^-$GaN layer 303, the gate insulating film 105 and the gate electrode 106 are replaced by the gate insulating film 305 extending from the GaN layer 103 through the side face of the N$^-$GaN layer 303 to the upper face thereof and the gate electrode 306.

The N$^-$GaN layer 303 is a film representing some degree of n-type conductivity due to the donor ions in the film forming processes, and has the same function as the RESURF region 204 described with reference to the FET 200. The thickness of the N$^-$GaN layer 303 can be set to 130 nm, for example. The gate insulating film 305 and the gate electrode 306 are configured to be formed directly on the GaN layer 103 at the source side, and extended through the side face of the N$^-$GaN layer 303 to the upper face thereof at the drain side. Although the example applying the N$^-$GaN layer 303 is described in the FET 300, such nitride semiconductor as AlGaN, BGaN, InGaN, AlN, InN having at least one of Al, Ga, In and B which are group-III elements can be applied.

The method of producing the FET 300 depicted in FIG. 5 is described with reference to FIGS. 6-1 to 6-3. In the same manner as the method of producing the FET 100, the buffer layer 102, the GaN layer 103 with Mg doped are epitaxially grown in this order. Then, the GaN film having the thickness of about 130 nm, for example, is formed on the GaN layer 103 applying the MOCVD, HVPE, or MBE.

Then, after the SiO$_2$ film having the thickness of about 1000 nm, for example, is grown applying PECVD, the SiO$_2$ film is prepared as a mask oxide film having apertures in the source portion (not shown) applying photolithography and etching techniques. The GaN film and the GaN layer 103 are etched with the above described mask to reach to the depth of about 140 nm from the surface of the GaN film. Thus, the GaN film in the source side is removed to expose the GaN layer 103, and the layered structure, in which the N⁻GaN layer 303 exists on the GaN layer 103 in the drain side, can be formed, as depicted in FIG. 6-1. The mask oxide film (not shown) is removed by the use of hydrofluoric acid, for example.

After that, the $SiO_2$ film is grown having the thickness of about 1000 nm, for example, applying PECVD, for example. Then, a mask oxide film M1 having apertures is formed applying photolithography and etching techniques so that the surface of the region forming the impurities implant region 104a at the source side in the GaN layer 103, and the surface of the region forming the impurities implant region 104a in the N⁻GaN layer 303 are exposed. Furthermore, after forming the $SiO_2$ film M12 all over the surface of the substrate, Si ions are implanted with the use of the mask oxide film M1 in the GaN layer 103 and N⁻GaN layer 303 under the condition of $1.5 \times 10^{14}$ cm/45 keV to form the impurities implant region 104a with the Si ions as n-type impurities implanted. After that, the mask oxide film M1 and $SiO_2$ film M12 are removed by the use of hydrofluoric acid, for example.

Then, in the same procedure as the method of producing the FET 100, a $SiO_2$ film having a thickness of 60 nm is formed as the gate insulating film 105a all over the surface of the substrate. Following the above, a poly-Si film with P doped is formed all over the surface of the substrate is formed, and the dielectric layer 306a functioning as the gate electrode is formed using photolithography and etching techniques, as depicted in FIG. 6-2.

Then, the ultraviolet laser beam L is irradiated to all over the substrate to implement the activation process using ultraviolet lasing system, as depicted in FIG. 6-2. As a result, the impurities implant regions 104a with no dielectric layer 306a formed thereon absorb the reached ultraviolet laser beam L to raise the temperature themselves to activate the Si ions to form N⁺GaN regions 104, as depicted in FIG. 6-3.

Furthermore, the dielectric film 306a absorbs the reached ultraviolet laser beam L to raise the temperature therein to activate phosphorus (P) contained in the dielectric film 306a to come to function as the gate electrode 306, as depicted in FIG. 6-3. In this case, in the same process as the method of producing the FET 100, the thermal conductivity in the dielectric film 306a is blocked by the gate insulating film 305 having a lower heat transfer than the dielectric film 306a, so that the surface of the GaN layer 103 directly beneath the dielectric film 306a and the surface of the N⁻GaN layer are not heated at the high temperature.

Then, in the same process as the method of producing the FET 100, the apertures to expose each of the N⁺GaN regions 104 is formed, and then, the source electrode 107 and the drain electrode 108 are formed so as to fabricate the FET 300 having the cross sectional structure as depicted in FIG. 5.

As described above, according to the present invention, the ultraviolet laser beam L is irradiated to raise the temperature of only the impurities implant regions 104a and the dielectric film 306a, instead of raising the temperature of the whole substrate, so as to selectively activate the impurities contained only in the impurities implant regions 104 and the dielectric film 306a.

Thus, it is possible to fabricate the FET 300 in which Ga is not segregated on the surface of the GaN film, and pits caused by evaporating of N atom and Ga atom as well as the increase of the resistance caused by evaporating of N from the GaN film can be effectively prevented from being generated, contrary to the conventional problems.

Furthermore, since one time of irradiation of the ultraviolet laser beam L can activate the impurities implanted in the GaN layer 103 as well as N⁻GaN layer 303, and contained in the dielectric film 306a, it is possible to fabricate the FET 300 by simple processes compared with the conventional processes so as to improve the reliability of the FET 300.

Figure 7:
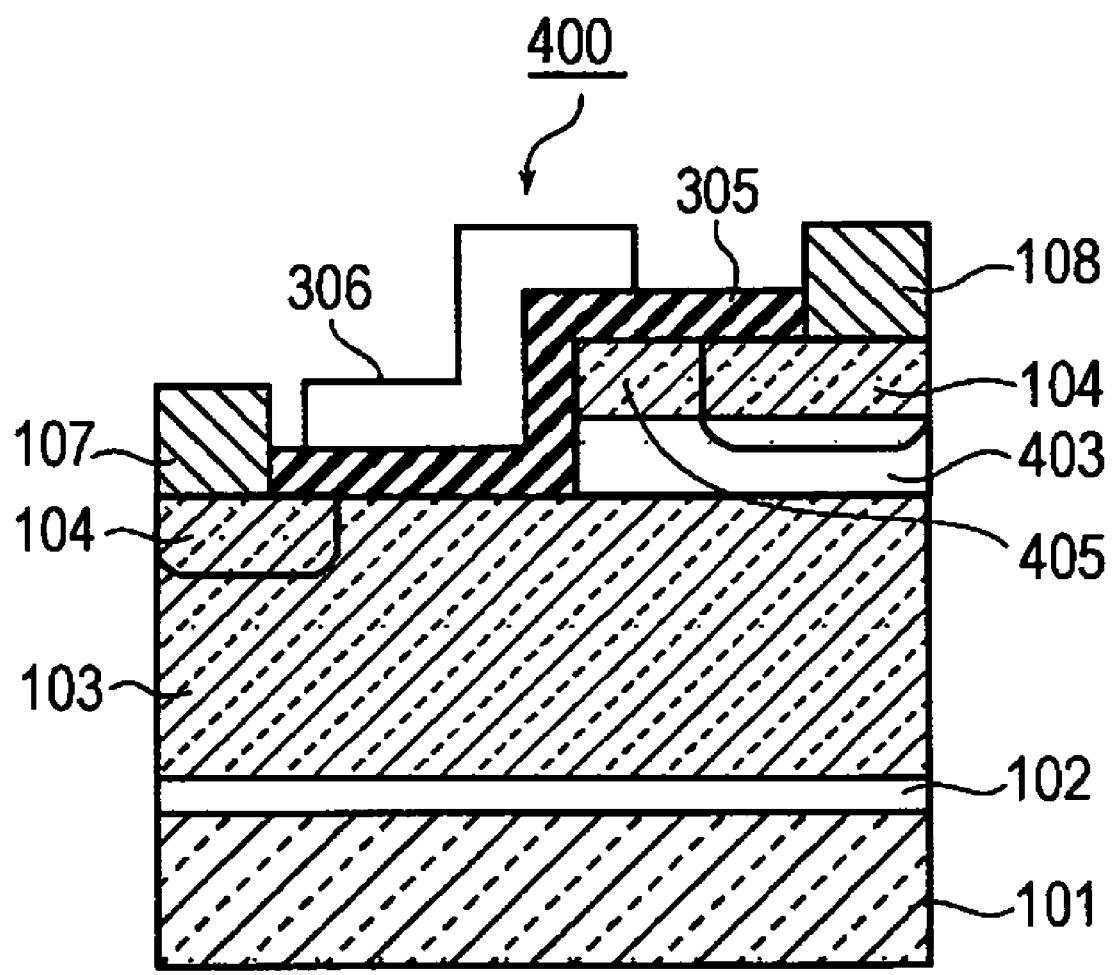
FIG. 7 is a cross sectional view showing an example of the structure of the FET.

The case of the FET 400, in which the method of producing the field effect transistor is applied, is more specifically described with reference to FIG. 7. FIG. 7 is a cross sectional view of a GaN field effect transistor (FET 400) cut along the direction vertical to the substrate and parallel to the channel length direction. As depicted in FIG. 7, in the FET 400, the N⁻GaN layer 303 in the same embodiment as the FET 300 as depicted in FIG. 5 is replaced by a multi-layered film of the N⁻GaN layer 403 and N⁻AlGaN layer 405.

The N⁻GaN layer 403 is a layer to function as a 2-DEG layer, and formed by a non-doped group III nitride semiconductor. However, the N⁻GaN layer 403 represents some degree of n-type conductivity due to the residual donor in the growing processes, and has a thickness of about 100 nm. Although the example applying the N⁻GaN layer 303 is described in the FET 400, such nitride semiconductor as AlGaN, BGaN, InGaN, AlN, InN having at least one of Al, Ga, In and B which are group-III elements can be applied.

The N⁻AlGaN layer 405 is a film to function as a carrier supplying layer, and generates two dimensional electron gas directly beneath the hetero junction interface with the N⁻GaN layer 403 functioning as the carrier running layer. The N⁻AlGaN layer 405 is formed by a group III nitride semiconductor with n-type impurities doped, and has a thickness of about 30 nm, for example. In the FET 400, AiGaN is used as the group III nitride semiconductor, and Si ion is used as the n-type impurities. The composition thereof is $Al_{0.2}Ga_{0.8}N$, the concentration of the impurities is about $1 \times 10^{17}$ cm⁻³.

Although the example applying the N⁻GaN layer 303 is described in the FET 400, such nitride semiconductor as AlGaN, BGaN, InGaN, AlN, InN having at least one of Al, Ga, In and B which are group-III elements can be applied. Ge, Se, and Te can be applied as the n-type impurities.

The method of producing the FET 400 as depicted in FIG. 8 is described with reference to FIGS. 8-1 to 8-3. In the same manner as the method of producing the FET 100, the buffer layer 102, the GaN layer 103 with Mg doped are epitaxially grown in this order. Then, the GaN film having the thickness of about 100 nm, for example, is formed on the GaN layer 103 applying the MOCVD, HVPE, or MBE. Then, the AlGaN film with Si doped having a thickness of about 30 nm is formed on the GaN film applying the MOCVD, HVPE, or MBE.

The composition of the above film is made to be $Al_{0.2}Ga_{0.8}N$, and the concentration of the Si as the impurities is controlled to be around $1 \times 10^{17}$ cm⁻³ so as to form the AlGaN layer with n-type impurities comparatively lightly doped. Then, in the same process as the method of producing the FET 300, after element separating process is implemented, the film is prepared as a mask oxide film having apertures in the source portion (not shown). The AlGaN film, GaN film and the GaN layer 103 are etched with the above described mask to reach to the depth of about 140 nm from the surface of the AlGaN film so as to form the carrier running layer and the carrier supplying layer.

Thus, the AlGaN film and GaN film in the source side are removed to expose the GaN layer 103, and the layered structure, in which the N⁻GaN layer 303 and N⁻AlGaN layer 405 exist on the GaN layer 103 in the drain side, can be formed, as depicted in FIG. 8-1. The mask oxide film (not shown) is removed by the use of hydrofluoric acid, for example.

After that, the SiO$_2$ film is grown having the thickness of about 1000 nm, for example, applying PECVD, for example. Then, a mask oxide film M1 having apertures is formed applying photolithography and etching techniques as depicted in FIG. 8-1. The surface of the region forming the impurities implant region 104a at the source side in the GaN layer 103, and the surface of the region forming the impurities implant region 104a in the N⁻AlGaN layer 405 can thus exposed.

Furthermore, the SiO$_2$ film M12 is formed all over the surface of the substrate. Following the above, Si ions are implanted with the use of the mask oxide film M1 in the GaN layer 103 and N⁻AlGaN layer 405 under the condition of 1.5×10$^{14}$ cm/45 keV. Thus the impurities implant region 104a is formed with the Si ions as n-type impurities implanted. After that, the mask oxide film M1 and SiO$_2$ film M12 are removed by the use of hydrofluoric acid, for example.

Then, the SiO$_2$ film having a thickness of about 60 nm is formed as the gate insulating film 305a all over the surface of the substrate as depicted in FIG. 8-2, in the same manner as the method of producing the FET 100. After that, the dielectric film 306a functioning as the gate electrode is formed all over the surface of the substrate. Following the above, the ultraviolet laser beam L is irradiated to all the surface of the substrate to implement the activation process using ultraviolet lasing system, as depicted in FIG. 8-2. Accordingly, the impurities implant regions 104a with no dielectric layer 306a formed thereon absorb the reached ultraviolet laser beam L to raise the temperature themselves to activate the Si ions so as to form the N⁺GaN region, as depicted in FIG. 8-3.

Furthermore, the dielectric film 306a absorbs the reached ultraviolet laser beam L to raise the temperature itself to activate phosphorus (P) contained in the dielectric film 306a. The dielectric film 106a therefore becomes to function as the gate electrode 306, as depicted in FIG. 8-3. In this case, in the same manner as the method of producing the FET 100, the heat transfer in the dielectric film 306a is blocked by the gate insulating film 305 having a lower heat transfer than the dielectric film 306a. The surface of the GaN layer 103 directly beneath the dielectric film 306a and the surface of the N⁻GaN layer are therefore not heated at the high temperature.

Then, the apertures to expose each of the N⁺GaN regions 104 are formed in the same manner as the method of producing the FET 100. Then, the source electrode 107 and the drain electrode 108 are formed so as to fabricate the FET 400 having the cross sectional structure as depicted in FIG. 7.

Thus, it is possible to fabricate the FET 400 by the simple processes by irradiating one time the ultraviolet laser beam L, contrary to the conventional problems. More specifically, Ga is not precipitated on the surfaces of the GaN film and N⁻GaN layer, and pits caused by evaporating of N atom and Ga atom as well as the increase of the resistance caused by evaporating of N from the GaN film can be effectively prevented from being generated.

Although the embodiments of the method of producing the field effect transistor of the invention are described, in which the carrier moving layer is formed by the material of group III nitride semiconductor, it is applicable to the method of producing the FET using GaAs as the material.

However various embodiments of the invention are described, the present invention is not limited to the above described embodiments. The present invention is to be construed to include modifications which one of ordinary skill in the art can think of and replacements of the elements of the invention.

What is claimed is:

1. A method of producing a field effect transistor having a carrier moving layer formed of material including one of group-III nitride semiconductor material, GaAs, and SiC, the method comprising:
   implanting impurities in a first region of the carrier moving layer;
   forming an insulating film on the carrier moving layer, the insulating film transmitting laser beam with which the carrier moving layer to be irradiated;
   forming a protective film on a second region of the carrier moving layer where the impurity is not implanted; and
   activating the impurity by irradiating the carrier moving layer with the laser beam, wherein
   the laser beam has an energy higher than a bandgap energy of the material of the carrier moving layer,
   the insulating film has a heat transfer rate lower than that of the protective film,
   the protective film has a bandgap energy lower than that of the material of the carrier moving layer, and
   the protective film has a thickness with which the second region of the carrier moving layer is protected from being irradiated with the laser beam.

2. The method according to claim 1, wherein
   the carrier moving layer is formed of a GaN layer,
   the protective film is formed of an amorphous silicon layer, and
   the laser beam has a wavelength in a range from 0.15 μm to 0.365 μm.

3. The method according to claim 1, wherein
   the carrier moving layer is formed of a GaN layer,
   the protective film is formed of a polysilicon layer doped with an impurity,
   the laser beam has a wavelength in a range from 0.15 μm to 0.365 μm, and
   the activating includes simultaneously activating the impurity doped in the polysilicon layer.

4. The method according to claim 1, wherein the insulating film is a gate insulating film.

5. The method according to claim 1, wherein the group III nitride semiconductor material includes at least one of Ga, Al, and B.

6. The method according to claim 1, wherein the insulating film is one of SiO$_2$ film, SiNx film, Al$_2$O$_3$ film, and MgO film.

7. The method according to claim 2, wherein the bandgap energy of the protective film is 1.1 eV.

8. The method according to claim 1, wherein the laser beam is a pulsed laser beam.

9. The method according to claim 1, wherein the implanting includes implanting the impurity into a depth within a range from 10 nm to 150 nm from a surface of the carrier moving layer.

10. The method according to claim 3, wherein the bandgap energy of the protective film is 1.1 eV.

* * * * *